(12) United States Patent
Cheng

(10) Patent No.: US 12,520,622 B2
(45) Date of Patent: Jan. 6, 2026

(54) SUBSTRATE STRUCTURE, MANUFACTURING METHOD THEREFOR, LIGHT-EMITTING DEVICE AND MANUFACTURING METHOD THEREFOR

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 367 days.

(21) Appl. No.: 18/253,382

(22) PCT Filed: Nov. 27, 2020

(86) PCT No.: PCT/CN2020/132135
§ 371 (c)(1),
(2) Date: May 17, 2023

(87) PCT Pub. No.: WO2022/109991
PCT Pub. Date: Jun. 2, 2022

(65) Prior Publication Data
US 2023/0420605 A1    Dec. 28, 2023

(51) Int. Cl.
*H01L 33/00* (2010.01)
*H01L 33/16* (2010.01)
(Continued)

(52) U.S. Cl.
CPC ........ *H10H 20/018* (2025.01); *H10H 20/817* (2025.01)

(58) Field of Classification Search
CPC .......................... H10H 20/018; H10H 20/817
See application file for complete search history.

(56) References Cited

U.S. PATENT DOCUMENTS

| 2006/0084245 A1 | 4/2006 | Kohda | |
| 2008/0093622 A1* | 4/2008 | Li | H10H 20/819 |
| | | | 257/E33.001 |

(Continued)

FOREIGN PATENT DOCUMENTS

| CN | 1801498 A | 7/2006 |
| CN | 101192635 A | 6/2008 |

(Continued)

OTHER PUBLICATIONS

Machine English Translation of Zhang et al. (CN 111048635), A preparation method of chip and the chip Structure to be peeled off, published Apr. 21, 2020.*

(Continued)

*Primary Examiner* — Peniel M Gumedzoe
(74) *Attorney, Agent, or Firm* — Christopher R. Carroll; The Small Patent Law Group LLC

(57) ABSTRACT

A substrate structure, a method for manufacturing a substrate structure, a light-emitting device and a method for manufacturing a light-emitting device are provided. The substrate structure may include a base, a mask layer, and an epitaxial structure. The mask layer is provided on the base, where the mask layer is provided with an opening for exposing the base. The epitaxial structure is provided in the opening, where a material of the mask layer is different from a material of the epitaxial structure.

14 Claims, 6 Drawing Sheets

(51) Int. Cl.
   *H10H 20/01* (2025.01)
   *H10H 20/817* (2025.01)

(56) References Cited

U.S. PATENT DOCUMENTS

| | | | |
|---|---|---|---|
| 2010/0243987 A1* | 9/2010 | Liu | H10H 20/01335 257/14 |
| 2018/0204976 A1 | 7/2018 | Kim et al. | |
| 2020/0313033 A1 | 10/2020 | Hou et al. | |

FOREIGN PATENT DOCUMENTS

| | | | |
|---|---|---|---|
| CN | 101872815 | A | 10/2010 |
| CN | 102460743 | A1 | 5/2012 |
| CN | 109950201 | A | 6/2019 |
| CN | 111048635 | A | 4/2020 |
| CN | 101740677 | A | 6/2021 |
| JP | H10189955 | A | 7/1998 |
| WO | 2015147135 | A1 | 10/2015 |

OTHER PUBLICATIONS

State Intellectual Property Office of the People's Republic of China, Office Action and Search Report Issued in Application No. 202080107232.0, Apr. 10, 2025, 15 pages. (Submitted with Machine Translation).

CHEN Qi et al, "Van der Waals Epitaxy of III-V Compounds and Their Applications", Chinese Journal of Luminescence, vol. 41 No. 8 Aug. 2020, 14 pages. (Submitted with Abstract Translation).

ISA State Intellectual Property Office of the People's Republic of China, International Search Report Issued in Application No. PCT/CN2020/132135, Aug. 30, 2021, WIPO, 4 pages.

ISA State Intellectual Property Office of the People's Republic of China, Written Opinion of the International Searching Authority Issued in Application No. PCT/CN2020/132135, Aug. 30, 2021, WIPO, 6 pages. (Submitted with Machine/Partial Translation).

* cited by examiner

SUBSTRATE STRUCTURE, MANUFACTURING METHOD THEREFOR, LIGHT-EMITTING DEVICE AND MANUFACTURING METHOD THEREFOR

CROSS REFERENCE TO RELATED APPLICATIONS

This application is a National Stage of International Application No. PCT/CN2020/132135, filed on Nov. 27, 2020, the contents of all of which are incorporated herein by reference in their entirety.

TECHNICAL FIELD

The present disclosure relates to the field of semiconductor technologies, and in particular to a substrate structure, a method for manufacturing a substrate structure, a light-emitting device and a method for manufacturing a light-emitting device.

BACKGROUND

In recent years, a light-emitting diode (LED), as a new generation of green light source, are widely used in lighting, backlighting, display, indication and other fields.

Currently, in the process of manufacturing a light-emitting diode, it is often necessary to epitaxially grow a light-emitting structure layer on a substrate to form a light-emitting diode. Since the substrate absorbs the light emitted from the light-emitting structure layer, resulting in a decrease in the light-emitting efficiency of the light-emitting diode, the substrate needs to be removed. However, it is difficult to remove the substrate.

SUMMARY

The present disclosure aims to provide a substrate structure, a method for manufacturing a substrate structure, a light-emitting device and a method for manufacturing a light-emitting device to solve the problem of difficulty in removing a substrate.

According to an aspect of the present disclosure, there is provided a substrate structure, which is applied to a light-emitting device. The substrate structure includes:
a base;
a mask layer provided on the base, where the mask layer is provided with an opening for exposing the base; and
an epitaxial structure provided in the opening, where a material of the mask layer is different from a material of the epitaxial structure.

According to an embodiment of the present disclosure, the epitaxial structure protrudes from the opening.

According to an embodiment of the present disclosure, both the opening and the epitaxial structure are plural in number, a plurality of the epitaxial structures correspond to a plurality of the openings one by one, the plurality of openings are spaced apart, and the plurality of the epitaxial structures are spaced apart.

According to an embodiment of the present disclosure, a material of the base or the epitaxial structure includes silicon, germanium or a silicon-germanium alloy.

According to an embodiment of the present disclosure, the base is an off-orientation substrate, and the base has a bias angle of 0° to 8°.

According to an embodiment of the present disclosure, the mask layer is a reflector.

According to an aspect of the present disclosure, there is provided a method for manufacturing a substrate structure, which is applied to a light-emitting device. The method includes:
forming a mask layer on a base, where the mask layer is provided with an opening for exposing the base; and
performing epitaxial growth on the base with the mask layer as a mask to form an epitaxial structure, where the epitaxial structure is provided in the opening, and a material of the mask layer is different from a material of the epitaxial structure.

According to an aspect of the present disclosure, there is provided a method for manufacturing a substrate structure, which is applied to a light-emitting device. The method includes:
forming an epitaxial layer on a base;
patterning the epitaxial layer to form an epitaxial structure, where an area of a section of the epitaxial structure in a direction parallel to the base is smaller than an area of the base;
forming an oxide layer on a surface of the base and on a surface of the epitaxial structure; and
removing a portion of the oxide layer disposed on an upper surface of the epitaxial structure to form a mask layer, where the mask layer has an opening for exposing the epitaxial structure, and a material of the mask layer is different from a material of the epitaxial structure.

According to an aspect of the present disclosure, there is provided a light-emitting device. The light-emitting device includes:
the above-mentioned substrate structure; and
a light-emitting structure layer disposed on a side of the epitaxial structure away from the base.

According to an embodiment of the present disclosure, the light-emitting structure layer protrudes from the epitaxial structure in a direction parallel to the base, a surface facing towards the mask layer of a portion of the light-emitting structure layer protruding from the epitaxial structure is provided at an angle to the base, and an area of an upper surface of the light-emitting structure layer is larger than an area of a lower surface of the light-emitting structure layer in contact with the epitaxial structure.

According to an embodiment of the present disclosure, the angle between the surface facing towards the mask layer of the portion of the light-emitting structure layer protruding from the epitaxial structure and the base is 20° to 70°.

According to an aspect of the present disclosure, there is provided a method for manufacturing a light-emitting device. The method includes:
manufacturing a substrate structure by the above-mentioned method for manufacturing a substrate structure; and
epitaxially growing a light-emitting structure layer on the epitaxial structure of the substrate structure.

According to an embodiment of the present disclosure, the method further includes:
removing the substrate structure.

The present disclosure provides a substrate structure, a method for manufacturing a substrate structure, a light-emitting device and a method for manufacturing a light-emitting device. The light-emitting structure layer is epitaxially grown on a surface away from the base of the epitaxial structure of the substrate structure to form the light-emitting device. The mask layer is provided on the base, and the epitaxial structure is provided in the opening of the mask layer which is configured to expose the base, such that an area of the surface of the epitaxial structure away from the base is smaller than an area of the base, thereby an area of the contact surface of the light-emitting structure layer with the substrate structure is reduced, as a result, it is easy to remove the substrate structure, and the problem of difficulty in removing a substrate is solved. In an embodiment, the light-emitting structure layer is provided on a side of the epitaxial structure away from the base, and a surface facing towards the mask layer of a portion of the light-emitting structure layer protruding from the epitaxial structure is provided at an angle to the base, which is conducive to achieving total reflection of light and reducing the leakage of light.

Figure 1:
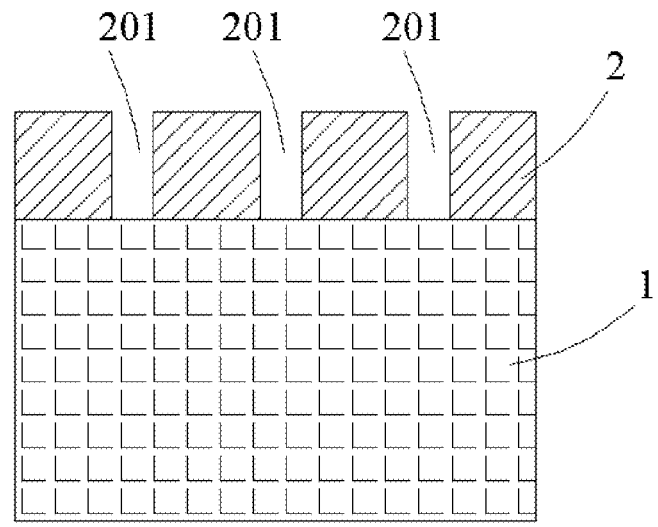
FIG. 1 is a schematic diagram illustrating a base and a mask layer of a substrate structure according to an embodiment 1 of the present disclosure.

List of reference numerals: base 1; mask layer 2; opening 201; epitaxial structure 3; light-emitting structure layer 4; first conductive type semiconductor layer 401; active layer 402; second conductive type semiconductor layer 403; epitaxial layer 5; oxide layer 6.

DETAILED DESCRIPTION OF THE EMBODIMENTS

Exemplary embodiments will be described in detail herein, examples of which are represented in the drawings. Where the following description relates to the accompanying drawings, the same numerals in the different drawings indicate the same or similar elements unless otherwise indicated. The embodiments described in the following exemplary embodiments do not represent all embodiments that are consistent with the present disclosure. Rather, they are only examples of devices that are consistent with some aspects of the present disclosure, as detailed in the appended claims.

Embodiment 1

Figure 2:
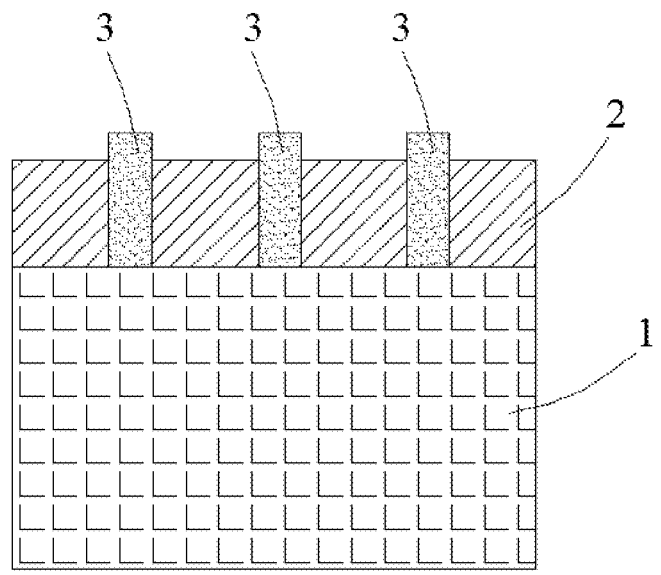
FIG. 2 is a schematic diagram illustrating the substrate structure according to the embodiment 1 of the present disclosure.

The embodiment 1 of the present disclosure provides a substrate structure and a method for manufacturing the substrate structure. The substrate structure can be applied to a light-emitting device. The light-emitting device may be a light-emitting diode (LED). As shown in FIGS. 1 and 2, the substrate structure may include a base 1, a mask layer 2, and an epitaxial structure 3.

The mask layer 2 is provided on the base 1. The mask layer 2 is provided with an opening 201 that exposes the base 1. The epitaxial structure 3 is provided in the opening 201 of the mask layer 2. The material of the mask layer 2 is different from the material of the epitaxial structure 3.

In the use of the substrate structure of the embodiment 1 of the present disclosure, a surface of the epitaxial structure 3 away from the base 1 is used to grow a light-emitting structure layer 4 to form a light-emitting device. Since the mask layer 2 is provided on the base 1, the epitaxial structure 3 is provided in the opening 201 of the mask layer 2 which exposes the base 1, such that an area of the surface of the epitaxial structure 3 away from the base 1 is smaller than an area of the base 1, thereby an area of a contact surface of the light-emitting structure layer 4 with the substrate structure is reduced, as a result, it is easy to remove the substrate structure, and the problem of difficulty in removing a substrate is solved.

The various parts of the substrate structure of this embodiment 1 are described in detail below.

As shown in FIGS. 1 and 2, the material of the base 1 may be silicon, or the material of the base 1 may be germanium, but the present disclosure is not limited to thereto, and the material of the base 1 may also be a silicon-germanium alloy. The base 1 may be an off-orientation substrate, and the base 1 has a bias angle of 0° to 8°, such as 0°, 2°, 4°, 8°, etc. Based on this, the problem of uneven growth of the (111) crystal plane of silicon can be solved, and defects such as phase domains and grain boundaries in the epitaxial structure 3 are reduced and the quality is improved.

As shown in FIG. 1, this mask layer 2 is provided on the base 1. The material of the mask layer 2 can be different from the material of the base 1. For example, the material of the mask layer 2 may be silicon oxide, such as $SiO_2$. the mask layer 2 is provided with the opening 201, which pass through the mask layer 2 in a thickness direction of the mask layer 2. A number of the opening 201 may be one, two, four, or more. When the opening 201 is plural in number, the plurality of openings 201 are spaced apart. Since the openings 201 penetrate the mask layer 2, the base 1 is exposed through the openings 201 in the mask layer 2.

As shown in FIGS. 1 and 2, the epitaxial structure 3 is provided in the opening 201 in the mask layer 2. The epitaxial structure 3 may be coupled to a region of the base 1 exposed to the opening 201. The materials of the base 1 and the epitaxial structure 3 may be the same or different. The material of the epitaxial structure 3 may also be silicon, germanium or a silicon-germanium alloy. The number of the epitaxial structure 3 may be the same as the number of the openings 201 in the mask layer 2. For example, when the opening 201 in the mask layer 2 is plural in number, the epitaxial structure 3 is also plural in number, and the plurality of epitaxial structures 3 are provided in the plurality of openings 201 one by one, and the plurality of epitaxial structures 3 are spaced apart. The epitaxial structures 3 may protrude from the openings 201 in the mask layer 2.

Figure 3:
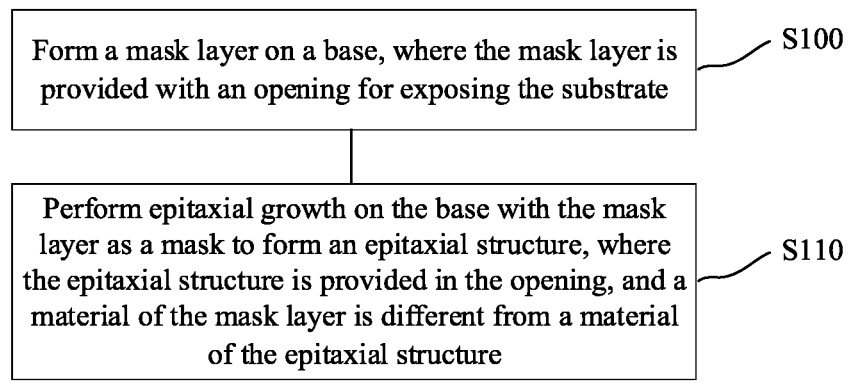
FIG. 3 is a flowchart illustrating a method for manufacturing the substrate structure according to the embodiment 1 of the present disclosure.

The above-mentioned substrate structure is manufactured by a method for manufacturing a substrate structure according to the embodiment 1 of the present disclosure. As shown in FIG. 3, the method for manufacturing the substrate structure may include steps 100 to 110.

At step 100, a mask layer is formed on a base, where the mask layer is provided with an opening that exposes the base.

At step 110, epitaxial growth on the base is performed with the mask layer as a mask to form an epitaxial structure, where the epitaxial structure is provided in the opening, and a material of the mask layer is different from a material of the epitaxial structure.

The steps of the method for manufacturing the substrate structure of the embodiment 1 of the present disclosure are described in detail below.

In the step 100, the mask layer is formed on the base, and the mask layer is provided with the opening that exposes the base.

A structure after the step 100 is shown in FIG. 1. For example, the step 100 may include: forming a dielectric material layer on the base 1; and patterning the dielectric material layer to form the mask layer 2, where the mask layer 2 is provided with an opening 201 for exposing the base 1. The dielectric material layer may be patterned by a photolithography process, but embodiments of the present disclosure are not limited thereto. In addition, the material of the dielectric material layer is different from the material of the base 1.

In the step 110, the epitaxial growth on the base is performed with the mask layer as a mask to form an epitaxial structure, where the epitaxial structure is provided in the opening, and the material of the mask layer is different from the material of the epitaxial structure.

A structure after the step 110 is shown in FIG. 2. The epitaxial growth can be performed on the base 1 by atomic layer deposition in this embodiment 1, or the epitaxial growth can also be performed on the base 1 by chemical vapor deposition, but the embodiments of the present disclosure are not limited thereto. Since the material of the mask layer 2 is different from the material of the epitaxial structure 3, it is thus difficult to grow the epitaxial structure 3 on the surface of the mask layer 2.

The method and the substrate structure provided in the embodiment 1 of the present disclosure belong to the same inventive concept, and the description of the relevant details and beneficial effects can be referred to each other without further elaboration.

Embodiment 2

A substrate structure and a method for manufacturing the same of the embodiment 2 of the present disclosure are substantially the same as that of the embodiment 1 of the present disclosure, with the difference only being that the mask layer of the embodiment 2 of the present disclosure is a reflector. For example, the mask layer of this embodiment 2 is a distributed Bragg reflector. The material of the distributed Bragg reflector may be selected from a group of multi-periodic materials including $TiO_2/SiO_2$, $SiO_2/SiN$, $Ti_3O_5/SiO_2$, $Ta_2O_5/SiO_2$, $Ti_3O_5/Al_2O_3$, $ZrO_2/SiO_2$, or $TiO_2/Al_2O_3$, but the embodiments of the present disclosure are not limited thereto.

Compared with the embodiment 1, the mask layer of this embodiment 2 is a reflector, which can reflect light, thereby the base and the epitaxial structure in this embodiment 2 need not be removed, the manufacturing process is simplified, and the external quantum efficiency and the light-emitting efficiency of the light-emitting device are improved.

Embodiment 3

A substrate structure and a method for manufacturing the same of the embodiment 3 are substantially the same as that of the embodiment 2, with the difference only being that: the mask layer of the embodiment 2 is a metal reflector. A material of the metal reflector may be Ag, Ni/Ag/Ni, etc., but the embodiments of the present disclosure are not limited to thereto.

Embodiment 4

Figure 4:
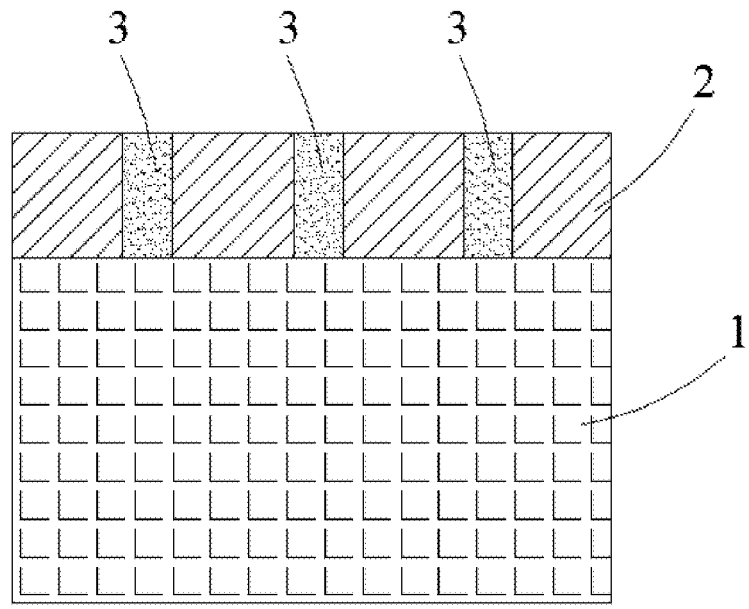
FIG. 4 is a schematic diagram illustrating a substrate structure according to an embodiment 4 of the present disclosure.

A substrate structure and a method for manufacturing the same of the embodiment 4 are substantially the same as that of any one of the embodiments 1 to 3, with the difference only being that: the epitaxial structure 3 of the embodiment 4 does not protrude from the opening 201 of the mask layer 2, as shown in FIG. 4. A surface of the epitaxial structure 3 away from the base 1 can be flush with a surface of the mask layer 2 away from the base 1, in other words, the distance between the surface of the epitaxial structure 3 away from the base 1 and the surface of the base 1 facing towards the mask layer 2 is equal to the distance between the surface of the mask layer 2 away from the base 1 and the surface of the base 1 facing towards the mask layer 2. Alternatively, the distance between the surface of the epitaxial structure 3 away from the base 1 and the surface of the base 1 facing towards the mask layer 2 may be less than the distance between the surface of the mask layer 2 away from the base 1 and the surface of the base 1 facing towards the mask layer 2.

Embodiment 5

Figure 5:
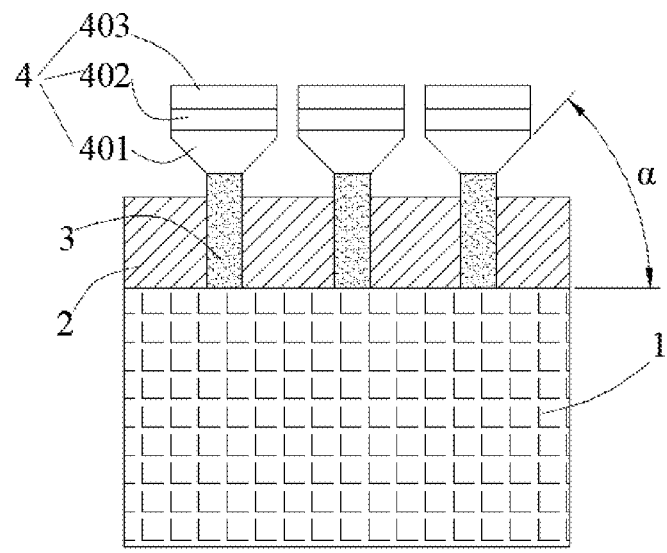
FIG. 5 is a schematic diagram illustrating a light-emitting device according to an embodiment 5 of the present disclosure.

The embodiment 5 of the present disclosure provides a light-emitting device and a method for manufacturing the same. The light-emitting device may be a light-emitting diode (LED). As shown in FIG. 5, the light-emitting device may include a light-emitting structure layer 4 and a substrate structure as described in any one of the embodiments 1 to 4. The light-emitting structure layer 4 may be provided on a side of the epitaxial structure 3 in the substrate structure away from the base 1. For example, when the material of the base 1 is silicon and the mask layer 2 is a reflector, the light emitted from the light-emitting structure layer 4 can be reflected by the mask layer 2, such that the absorption of light by the base 1 is weakened, and the light-emitting efficiency of the light-emitting device is improved.

As shown in FIG. 5, the light-emitting structure layer 4 may include a first conductive type semiconductor layer 401, an active layer 402, and a second conductive type semiconductor layer 403 stacked. the active layer 402 may be at least one of a single quantum well structure, a multiple quantum well (MQW) structure, a quantum line structure, or a quantum dot structure. For example, the active layer 402 is a multiple quantum well structure, and the active layer 402 may include potential well layers and potential barrier layers alternately provided. The first conductivity type is different from the second conductivity type. The first conductive type semiconductor layer 401 may be an N-type semiconductor layer, and the second conductive type semiconductor layer 403 may be a P-type semiconductor layer, but the embodiments of the present disclosure are not particularly limited thereto. In addition, the first conductive type semiconductor layer 401 may be disposed on a side of the second conductive type semiconductor layer 403 near the epitaxial structure 3. The N-type semiconductor layer is configured to provide electrons and the P-type semiconductor layer is configured to provide holes, such that the electrons and the holes are compounded in the active layer 402 to emit light. The N-type semiconductor layer and/or the P-type semiconductor layer may include a group III nitride material. The group III nitride material may be at least one of GaN, AlGaN, InGaN, or AlInGaN. The N-type ion in the N-type semiconductor layer may be at least one of a Si ion, a Ge ion, a Sn ion, a Se ion, or a Te ion. The P-type doping ion in the P-type semiconductor layer may be at least one of a Mg ion, a Zn ion, a Ca ion, a Sr ion, or a Ba ion.

As shown in FIG. 5, the light-emitting structure layer 4 protrudes from the epitaxial structure 3 in a direction parallel to the base 1, that is, an orthographic projection of the light-emitting structure layer 4 on the base 1 is larger than an orthographic projection of the epitaxial structure 3 on the base 1, and the orthographic projection of the epitaxial structure 3 on the base 1 is located within the region of the orthographic projection of the light-emitting structure layer 4 on the base 1. A surface facing towards the mask layer 2 of a portion of the light-emitting structure layer 4 protruding from the epitaxial structure 3 is provided at an angle to the base 1, and an area of an upper surface of the light-emitting structure layer 4 is larger than an area of a lower surface of the light-emitting structure layer 4 in contact with the epitaxial structure 3, this is beneficial for achieving total reflection of light and reducing light leakage. Where the upper surface of the light-emitting structure layer 4 is a surface of the light-emitting structure layer 4 away from the base 1, and the lower surface of the light-emitting structure layer 4 is a surface of the light-emitting structure layer 4 facing towards the base 1. The angle between the surface facing towards the mask layer 2 of the portion of the light-emitting structure layer 4 protruding from the epitaxial structure 3 and the base 1 is 20° to 70°, such as 36°, 55°, 60°, 70°, etc. For example, the first conductive type semiconductor layer 401 is disposed on a side of the second conductive type semiconductor layer 403 near the epitaxial structure 3, and the surface facing towards the mask layer 2 of the portion of the light-emitting structure layer 4 protruding from the epitaxial structure 3 may be a surface facing towards the mask layer 2 of a portion of the first conductive type semiconductor layer 401 protruding from the epitaxial structure 3.

The light-emitting device of the embodiment 5 of the present disclosure may further include a first electrode and a second electrode. The first electrode may be electrically connected to the first conductive type semiconductor layer. The second electrode may be electrically connected to the second conductive type semiconductor layer.

Figure 6:
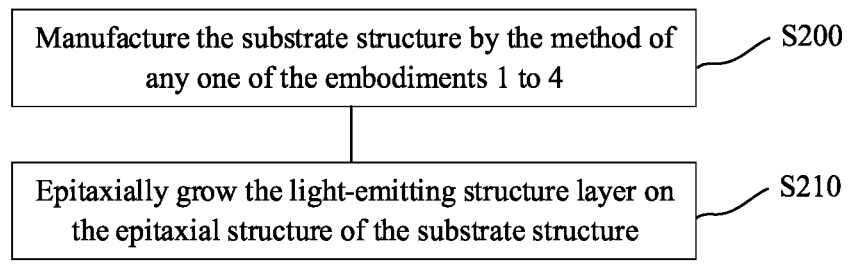
FIG. 6 is a flowchart illustrating a method for manufacturing the light-emitting device according to the embodiment 5 of the present disclosure.

The method for manufacturing a light-emitting device of the embodiment 5 of the present disclosure is used to manufacture the above-mentioned light-emitting device. As shown in FIG. 6, the method for manufacturing the light-emitting device may include steps 200 to 210.

At step 200, the substrate structure is manufactured by the method of any one of the embodiments 1 to 4.

At step 210, the light-emitting structure layer is epitaxially grown on the epitaxial structure of the substrate structure.

As shown in FIG. 5, for example, the material of the first conductive type semiconductor layer 401 of the light-emitting structure layer 4 includes GaN, in the step 210, it is difficult for both Ga atoms and N atoms to nucleate on the mask layer 2 of the substrate structure due to the difference in bonding energy, thereby it is difficult to grow the first conductive type semiconductor layer 401 on the mask layer 2.

The method and the light-emitting device provided in the embodiment 5 of the present disclosure belong to the same inventive concept, and the description of the relevant details and beneficial effects can be referred to each other without further elaboration.

Embodiment 6

A light-emitting device and a method for manufacturing the same of the embodiment 6 of the present disclosure is substantially the same as that of the embodiment 5 of the present disclosure, with the difference only being that: the substrate structure can be removed after the light-emitting structure layer is epitaxially grown on the epitaxial structure of the substrate structure. In this embodiment, the substrate structure can be removed by chemical etching and removing process. For example, the materials of the base and the epitaxial structure are silicon, and the etching solution used in the chemical etching and removing process may be a mixture of hydrofluoric acid, nitric acid, and acetic acid.

Embodiment 7

Figure 7:
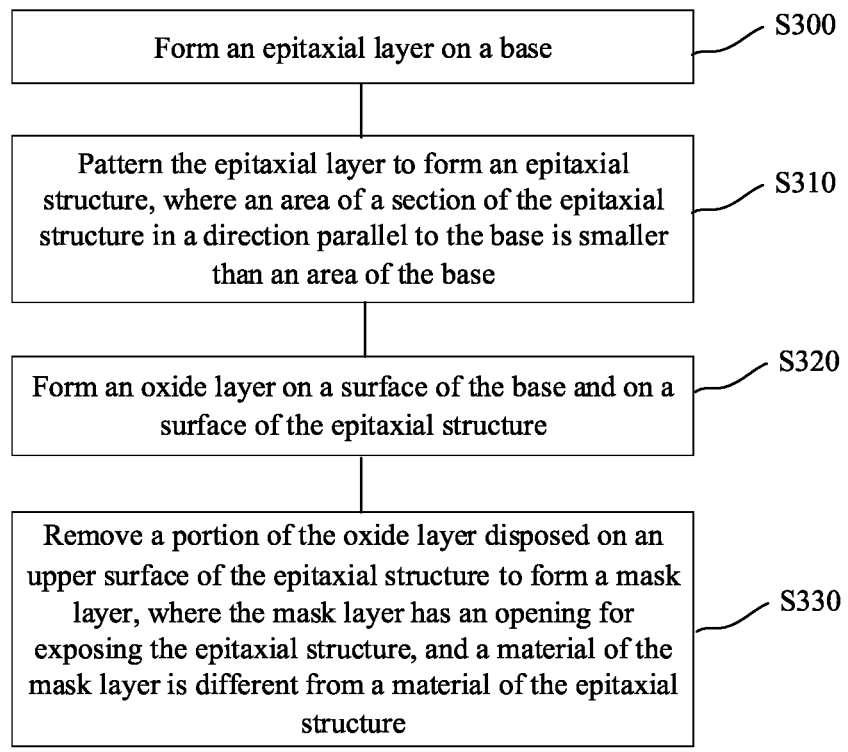
FIG. 7 is a flowchart illustrating a method for manufacturing a substrate structure according to an embodiment 7 of the present disclosure.

As shown in FIG. 7, a method for manufacturing a substrate structure of the embodiment 7 of the present disclosure may include steps 300 to 330.

At step 300, an epitaxial layer is formed on a base.

At step 310, the epitaxial layer is patterned to form an epitaxial structure, where an area of a section of the epitaxial structure in a direction parallel to the base is smaller than an area of the base.

At step 320, an oxide layer is formed on a surface of the base and on a surface of the epitaxial structure.

At step 330, a portion of the oxide layer disposed on an upper surface of the epitaxial structure is removed to form a mask layer, where the mask layer has an opening for exposing the epitaxial structure, and a material of the mask layer is different from a material of the epitaxial structure.

The base, the epitaxial structure, and the mask layer of the embodiment 7 of the present disclosure are the same as that of any one of the embodiments 1 to 4 of the present disclosure.

The steps of the method for manufacturing the substrate structure of the embodiment 7 of the present disclosure are described in detail below.

In the step 300, the epitaxial layer is formed on the base.

Figure 8:
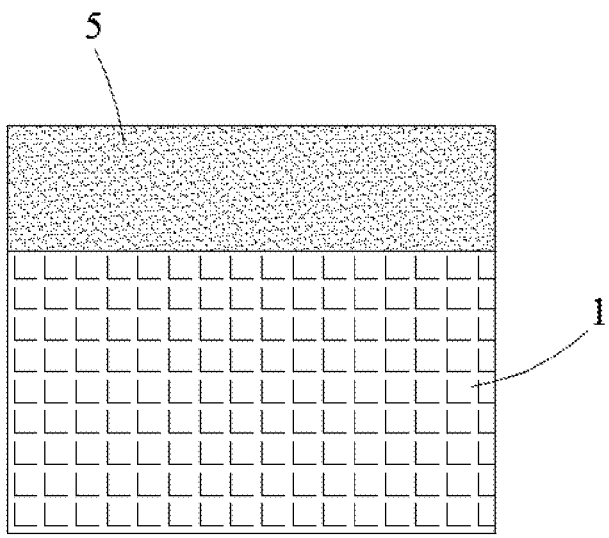
FIG. 8 is a schematic diagram illustrating a structure after step S300 in the method for manufacturing the substrate structure according to the embodiment 7 of the present disclosure.

As shown in FIG. 8, the material of the epitaxial layer 5 may be the same as or different from the material of the base 1. The material of the epitaxial layer 5 may be silicon, germanium, or a silicon-germanium alloy.

In the step 310, the epitaxial layer is patterned to form the epitaxial structure, which has a smaller cross-sectional area in a direction parallel to the base than the area of the base.

Figure 9:
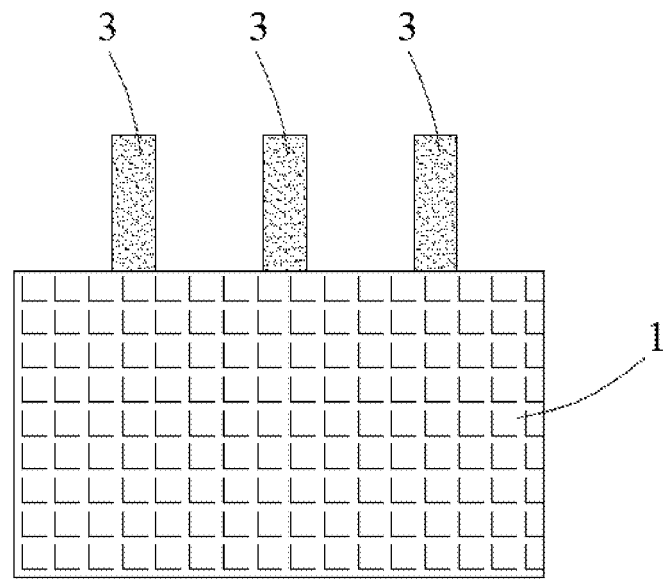
FIG. 9 is a schematic diagram illustrating a structure after step S310 in the method for manufacturing the substrate structure according to the embodiment 7 of the present disclosure.

As shown in FIGS. 8 and 9, the epitaxial layer 5 may be patterned by a photolithography process to form the epitaxial structure 3. In an embodiment, the structure consisting of the epitaxial layer 5 and the base 1 can be commonly referred to as a "substrate" by those skilled in the art, and the epitaxial layer 5 is patterned, that is, the "substrate" is patterned.

In the step 320, the oxide layer is formed on the surface of the base and on the surface of the epitaxial structure.

Figure 10:
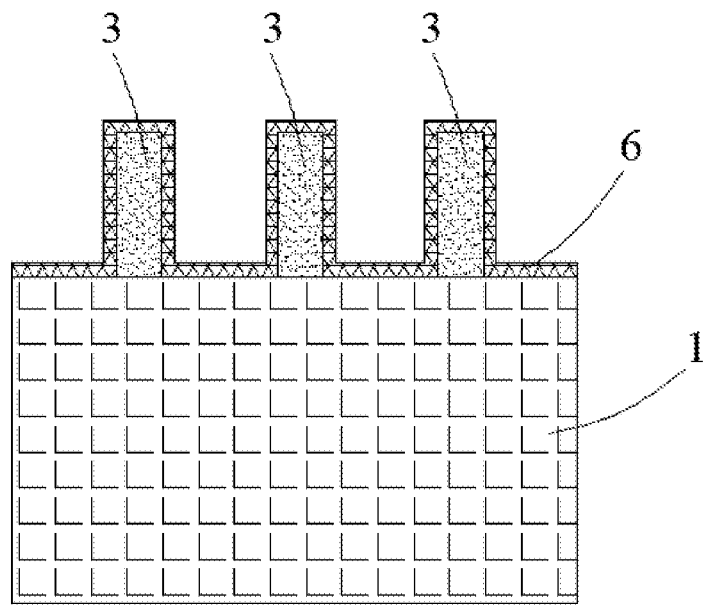
FIG. 10 is a schematic diagram illustrating a structure after step S320 in the method for manufacturing the substrate structure according to the embodiment 7 of the present disclosure.

As shown in FIG. 10, the oxide layer 6 can be formed on the surface of the base 1 and on the surface of the epitaxial structure 3 by oxidizing the base 1 and the epitaxial structure 3, and by controlling the time of oxidation, based on this, the material of the oxide layer 6 can be silicon oxide, etc. The oxide layer 6 can also be deposited, such as vapor deposition, etc. Based on this, the oxide layer 6 can be a multilayer structure and can have reflective properties. The oxide layer 6 is formed on the surface of the epitaxial structure 3, i.e., the oxide layer 6 is formed on the upper surface and the side walls of the epitaxial structure 3.

In the step 330, the portion of the oxide layer disposed on the upper surface of the epitaxial structure is removed to form a mask layer having an opening that exposes the epitaxial structure, and the material of the mask layer is different from the material of the epitaxial structure.

Figure 11:
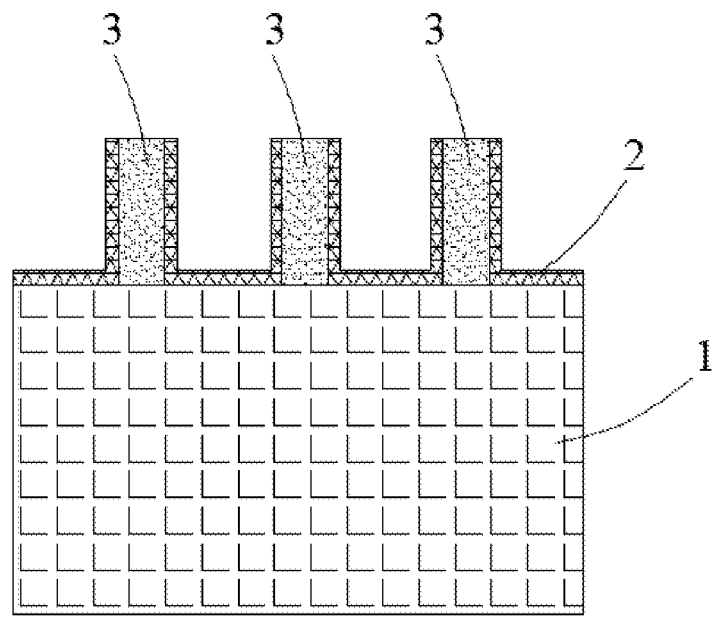
FIG. 11 is a schematic diagram illustrating a structure after step S330 in the method for manufacturing the substrate structure according to the embodiment 7 of the present disclosure.

As shown in FIGS. 10 and 11, the portion of the oxide layer 6 disposed on the upper surface of the epitaxial structure 3 can be removed by chemical vapor polishing (CMP) to form the mask layer 2.

Figure 12:
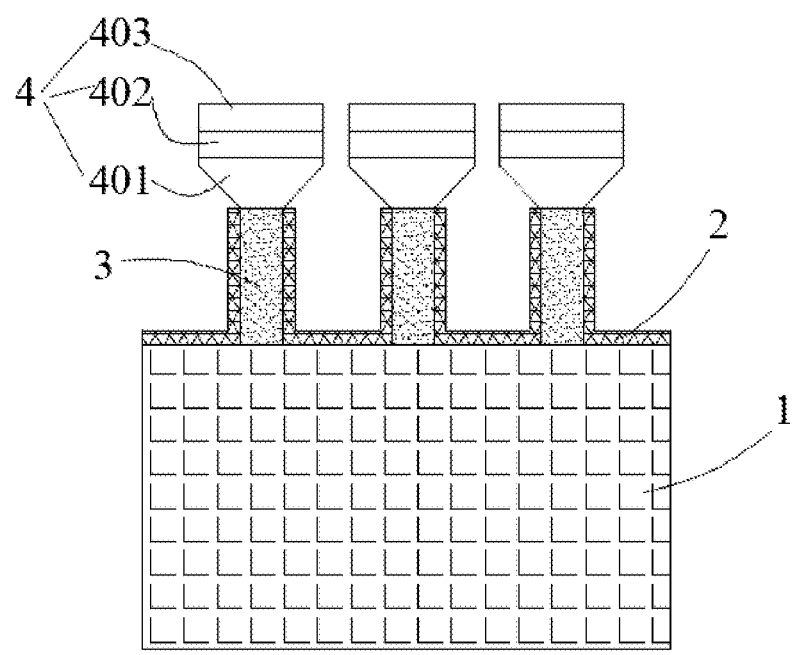
FIG. 12 is a schematic diagram illustrating a light-emitting device manufactured based on the substrate structure of the embodiment 7 of the present disclosure.

The light-emitting device formed based on the substrate structure of the embodiment 7 of the present disclosure is shown in FIG. 12.

The above embodiments are some embodiments of the present disclosure, and do not limit the present disclosure in any form. Although the present disclosure has been disclosed as above in the preferred embodiment, it is not intended to limit the present disclosure. Those skilled in the art, without departing from the scope of the technical solutions of the present disclosure, can make some changes or modifications to equivalent embodiments of equivalent changes by using the technical content disclosed above, in the case of where any content does not depart from the technical solutions of the present disclosure, any simple modifications and equivalent changes made to the above embodiments according to the technical essence of the present disclosure still fall within the scope of the technical solutions of the present disclosure.

The invention claimed is:

1. A substrate structure, applied to a light-emitting device, and comprising:
   a base;
   a mask layer provided on the base, wherein the mask layer is provided with an opening for exposing the base; and
   an epitaxial structure provided in the opening, wherein a material of the mask layer is different from a material of the epitaxial structure;
   wherein the epitaxial structure protrudes from the opening, a surface of the epitaxial structure away from the base is used to grow a light-emitting structure layer, the light-emitting structure layer protrudes from the epitaxial structure in a direction parallel to the base, a surface facing towards the mask layer of a portion of the light-emitting structure layer protruding from the epitaxial structure is provided at an angle to the base, and the angle between the surface facing towards the mask layer of the portion of the light-emitting structure layer protruding from the epitaxial structure and the base is 20° to 70°.

2. The substrate structure of claim 1, wherein both the opening and the epitaxial structure are plural in number, a plurality of the epitaxial structures correspond to a plurality of the openings one by one, the plurality of openings are spaced apart, and the plurality of the epitaxial structures are spaced apart.

3. The substrate structure of claim 1, wherein a material of the base or the epitaxial structure comprises silicon, germanium or a silicon-germanium alloy.

4. The substrate structure of claim 1, wherein the base is an off-orientation substrate, and the base has a crystal orientation bias angle of 0° to 8°.

5. The substrate structure of claim 1, wherein the mask layer is a reflector.

6. A light-emitting device, comprising:
   the substrate structure of claim 1; and
   a light-emitting structure layer disposed on a side of the epitaxial structure away from the base;
   wherein the epitaxial structure protrudes from the opening, the light-emitting structure layer protrudes from the epitaxial structure in a direction parallel to the base, a surface facing towards the mask layer of a portion of the light-emitting structure layer protruding from the epitaxial structure is provided at an angle to the base, and the angle between the surface facing towards the mask layer of the portion of the light-emitting structure layer protruding from the epitaxial structure and the base is 20° to 70°.

7. The light-emitting device of claim 6, wherein an area of an upper surface of the light-emitting structure layer is larger than an area of a lower surface of the light-emitting structure layer in contact with the epitaxial structure.

8. A method for manufacturing a substrate structure applied to a light-emitting device, comprising:
   forming a mask layer on a base, wherein the mask layer is provided with an opening for exposing the base; and
   performing epitaxial growth on the base with the mask layer as a mask to form an epitaxial structure, wherein the epitaxial structure is provided in the opening, and a material of the mask layer is different from a material of the epitaxial structure;
   wherein the epitaxial structure protrudes from the opening, a surface of the epitaxial structure away from the base is used to grow a light-emitting structure layer, the light-emitting structure layer protrudes from the epitaxial structure in a direction parallel to the base, a surface facing towards the mask layer of a portion of the light-emitting structure layer protruding from the epitaxial structure is provided at an angle to the base, and the angle between the surface facing towards the mask layer of the portion of the light-emitting structure layer protruding from the epitaxial structure and the base is 20° to 70°.

9. The method of claim 8, wherein the mask layer is a reflector.

10. A method for manufacturing a light-emitting device, comprising:
    manufacturing a substrate structure by the method of claim 7; and
    epitaxially growing a light-emitting structure layer on the epitaxial structure of the substrate structure.

11. The method of claim 10, further comprising:
removing the substrate structure.

12. A method for manufacturing a substrate structure applied to a light-emitting device, comprising:
forming an epitaxial layer on a base;
patterning the epitaxial layer to form an epitaxial structure, wherein an area of a section of the epitaxial structure in a direction parallel to the base is smaller than an area of the base;
forming an oxide layer on a surface of the base and on a surface of the epitaxial structure; and
removing a portion of the oxide layer disposed on an upper surface of the epitaxial structure to form a mask layer, wherein the mask layer has an opening for exposing the epitaxial structure, and a material of the mask layer is different from a material of the epitaxial structure;
wherein the epitaxial structure protrudes from the opening, a surface of the epitaxial structure away from the base is used to grow a light-emitting structure layer, the light-emitting structure layer protrudes from the epitaxial structure in a direction parallel to the base, a surface facing towards the mask layer of a portion of the light-emitting structure layer protruding from the epitaxial structure is provided at an angle to the base, and the angle between the surface facing towards the mask layer of the portion of the light-emitting structure layer protruding from the epitaxial structure and the base is 20° to 70°.

13. A method for manufacturing a light-emitting device, comprising:
manufacturing a substrate structure by the method of claim 12; and
epitaxially growing a light-emitting structure layer on the epitaxial structure of the substrate structure.

14. The method of claim 13, further comprising:
removing the substrate structure.

* * * * *